US012787678B2

(12) United States Patent
Chen et al.

(10) Patent No.: US 12,787,678 B2
(45) Date of Patent: Nov. 3, 2026

(54) DYNAMIC EXHAUST FOR CHEMICAL PROCESSING

(71) Applicant: Taiwan Semiconductor Manufacturing Company., Ltd., Hsinchu (TW)

(72) Inventors: Yi-Chang Chen, Hsinchu City (TW); Yao Hwan Kao, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 419 days.

(21) Appl. No.: 18/339,672

(22) Filed: Jun. 22, 2023

(65) Prior Publication Data

US 2024/0429067 A1 Dec. 26, 2024

(51) Int. Cl.
*H10P 72/00* (2026.01)

(52) U.S. Cl.
CPC ................................ *H10P 72/0402* (2026.01)

(58) Field of Classification Search
CPC .......... H01L 21/67017; F24F 2007/001; F16L 55/02718; H10P 72/0402; C23C 16/4412; H01J 37/32834
See application file for complete search history.

(56) References Cited

U.S. PATENT DOCUMENTS 6,145,544 A * 11/2000 Dutertre ............ F16L 55/02718 138/42
6,185,370 B1 2/2001 Sekimoto et al.
9,105,490 B2 8/2015 Wang et al.
9,236,267 B2 1/2016 De et al.
9,236,300 B2 1/2016 Liaw
9,406,804 B2 8/2016 Huang et al.
9,443,769 B2 9/2016 Wang et al.
9,520,482 B1 12/2016 Chang et al.
9,548,366 B1 1/2017 Ho et al.
9,576,814 B2 2/2017 Wu et al.
9,831,183 B2 11/2017 Lin et al.
9,859,386 B2 1/2018 Ho et al.
2002/0127509 A1 9/2002 Watanabe
2021/0356162 A1* 11/2021 Schmidt .............. F24F 13/0218
2022/0384216 A1* 12/2022 Park .................... H10P 72/0402

FOREIGN PATENT DOCUMENTS

KR 20100077887 A * 7/2010 ....... H01L 21/67253
KR 20190122081 A * 10/2019 ........ H01J 37/32009

OTHER PUBLICATIONS

English translation of KR-20190122081-A, dated Sep. 24, 2025 (Year: 2025).*
English translation of KR-20100077887-A, dated Sep. 24, 2025 (Year: 2025).*

* cited by examiner

*Primary Examiner* — Michael G Hoang
*Assistant Examiner* — Brett P. Mallon
(74) *Attorney, Agent, or Firm* — Sterne, Kessler, Goldstein & Fox P.L.L.C.

(57) ABSTRACT

The present disclosure describes a processing system that includes a stage configured to hold a substrate thereon and an exhaust system. The exhaust system can include a perforated plate with exhaust holes and an exhaust port. The perforated plate can be positioned between the substrate and the exhaust port. Each of the exhaust holes includes a shutter.

20 Claims, 17 Drawing Sheets

DYNAMIC EXHAUST FOR CHEMICAL PROCESSING

BACKGROUND

During semiconductor fabrication processes that require solvent exhaust removal, deposited films can dry or cure unevenly. Uneven curing can deleteriously affect critical dimension uniformity in semiconductor devices. As a result, smaller device dimensions can be difficult to produce.

BRIEF DESCRIPTION OF THE DRAWINGS

Aspects of the present disclosure are best understood from the following detailed description when read with the accompanying figures.

DETAILED DESCRIPTION

Figure 1:
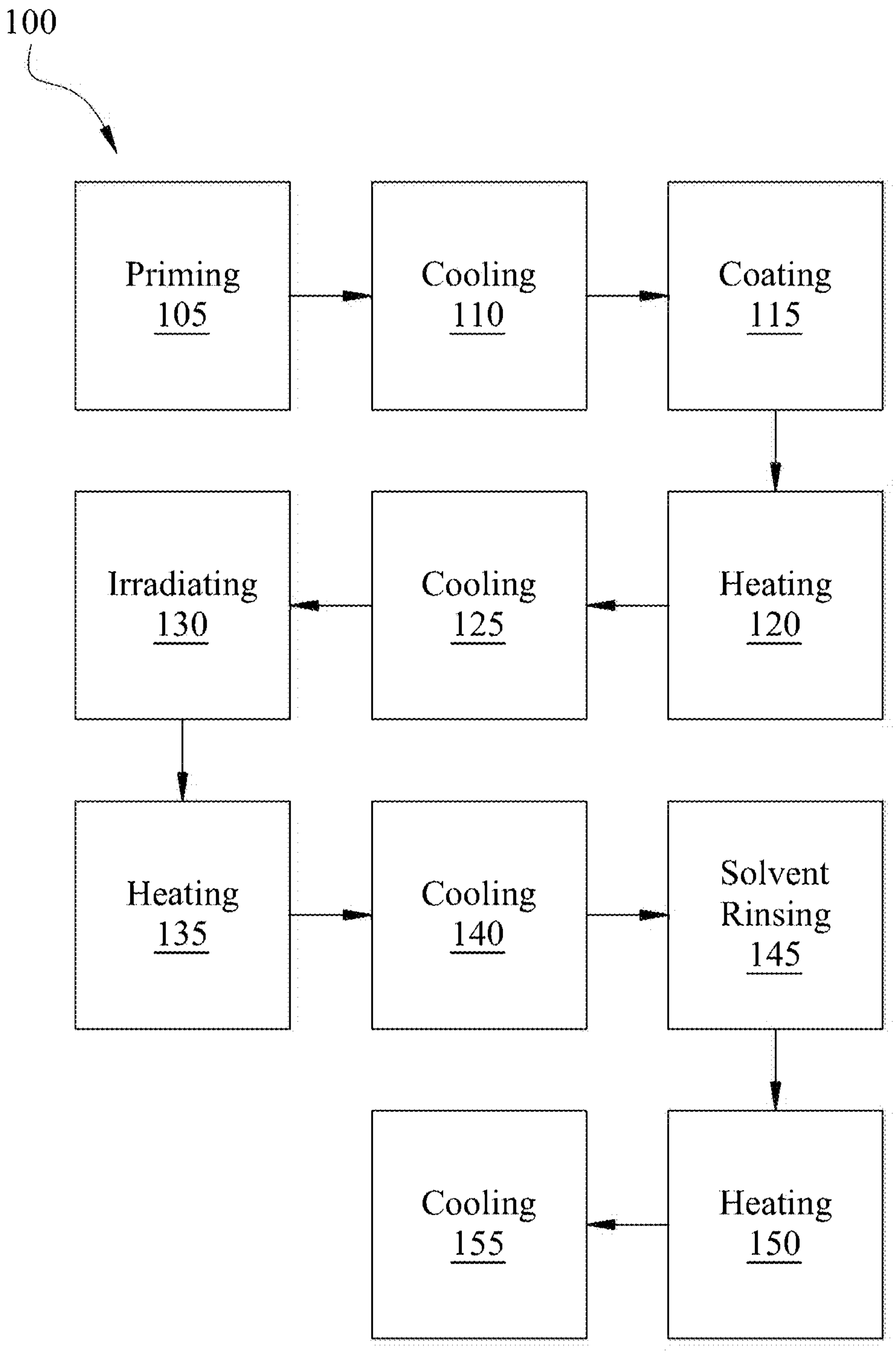
FIG. 1 is a flowchart for a semiconductor process incorporating a dynamic exhaust removal, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments of the present disclosure, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

As used herein, the meaning of "a," "an," and "the" includes singular and plural references unless the context clearly dictates otherwise.

The term "and/or" when used in a list of two or more items, means that any one of the listed items can be employed by itself or in combination with any one or more of the listed items. For example, the expression "A and/or B" is intended to mean either or both of A and B, i.e., A alone, B alone, or A and B in combination. The expression "A, B and/or C" is intended to mean A alone, B alone, C alone, A and B in combination, A and C in combination, B and C in combination or A, B, and C in combination.

The embodiments described herein are directed to a dynamic exhaust removal system for certain aspects of semiconductor manufacturing (for example, nanofabrication). In some embodiments of the present disclosure, the exhaust removal system includes a stage configured to hold a substrate thereon and the exhaust removal system. The exhaust removal system (for example, the exhaust system) can include a perforated plate with a plurality of exhaust holes and an exhaust port. The perforated plate can be positioned between the substrate and the exhaust port. In some embodiments of the present disclosure, each exhaust hole in the plurality of exhaust holes includes a shutter.

The perforated plate can have any shape and/or dimensions such that the perforated plate can be incorporated in any desired configuration. For example, the perforated plate can be provided in a circle shape, a square shape, an ellipse shape, a rectangle shape, a triangle shape, a pentagon shape, a hexagon shape, a heptagon shape, an octagon shape, nonagon shape, a decagon shape, a dodecagon shape, a hendecagon shape, a dodecahedron shape, or any suitable planar polygon shape.

In some embodiments of the present disclosure, the perforated plate can have similar dimensions to a silicon (Si) wafer. For example, the perforated plate can have a diameter of about 3 millimeters (mm), about 4 mm, about 5 mm, about 6 mm, about 7 mm, about 8 mm, about 9 mm, about 10 mm, about 15 mm, about 20 mm, about 25 mm, about 30 mm, about 35 mm, about 40 mm, about 45 mm, about 50 mm, about 60 mm, about 70 mm, about 80 mm, about 90 mm, about 100 mm, about 150 mm, about 200 mm, about 250 mm, about 300 mm, about 350 mm, about 400 mm, about 450 mm, or about 500 mm, based on the diameter of the Si wafer used in processing. In some embodiments of the present disclosure, the perforated plate can be larger than a Si wafer. In some embodiments of the present disclosure, the perforated plate can be smaller than the Si wafer.

Additionally, the perforated plate can have any thickness suitable to the desired application. For example, the perforated plate can have a thickness of about 500 μm, about 600 μm, about 700 μm, about 800 μm, about 900 μm, about 1 mm, about 2 mm, about 3 mm, about 4 mm, about 5 mm, about 6 mm, about 7 mm, about 8 mm, about 9 mm, or about 10 mm.

In some embodiments of the present disclosure, holes are disposed across the perforated plate in a radial configuration. In some embodiments of the present disclosure, the holes can be disposed across the perforated plate in a radial concentric configuration, a concentric configuration, a random configuration, a spiral configuration, a square configuration, a concentric elliptical configuration, or any suitable configuration according to desired exhaust removal.

In some embodiments of the present disclosure, each hole can include a shutter configured to control the diameter of an opening of each hole. For example, the shutter can be completely closed (for example, 0% of the diameter of the opening of the hole) or completely open (for example, open to 100% of the diameter of the hole). In some embodiments of the present disclosure, as illustrated below, the shutter can be open from about 1% of the diameter of the hole to about 99% of the diameter of the hole. For example, the shutter can be open to about 1%, about 2%, about 3%, about 4%, about 5%, about 10%, about 15%, about 20%, about 30%, about 40%, about 50%, about 60%, about 70%, about 80%, about 90%, or about 99% of the diameter of the hole.

In some embodiments of the present disclosure, the shutter can be positioned within each hole in the plurality of holes. For example, the shutter can be embedded within the perforated plate such that the shutter can extend from a sidewall of each hole in the plurality of holes toward the center of each hole to move into a closed configuration. In some embodiments of the present disclosure, the shutter can be positioned adjacent to each hole in the plurality of holes, for example, on the top of the perforated plate and covering each hole in the plurality of holes when in a closed configuration. Likewise, the shutter can be positioned on the bottom of the perforated plate, covering each hole in the plurality of holes when in a closed configuration.

In some embodiments of the present disclosure, the shutter is an iris shutter. The iris shutter can include a plurality of blades configured to define the opening of each hole in the plurality of holes. For example, the iris shutter can include 3 blades, 4 blades, 5 blades, 6 blades, 7 blades, 8 blades, 9 blades, 10 blades, 11 blades, 12 blades, 13 blades, 14 blades, 16 blades, 17 blades, 18 blades, 19 blades, 20 blades, or any suitable number of blades. In some embodiments of the present disclosure, the number of blades can define a shape of the opening (for example, 3 blades can form a triangular opening, 4 blades can form a square opening and so on until the opening is substantially circular). In some embodiments of the present disclosure, the number of blades and the corresponding hole shape defined by the number of blades can result in the exhaust flow having different flow dynamic characteristics. For example, an iris shutter having a higher number of blades (for example, 10-20 blades) can have an uninhibited exhaust flow through the hole. In other examples, the iris shutter having a lower number of blades (for example, 3-7 blades), the exhaust flow can be subjected to inhibited flow where a blade is blocking what could be an opening. For example, a triangular opening can have a tortuous exhaust flow path, where a substantially circular opening can have a less tortuous and/or smoother exhaust flow path.

In some embodiments of the present disclosure, the shutter is a lateral shutter (for example, a substantially straight-edged shutter that crosses the hole to close the hole). In some embodiments of the present disclosure, the shutter is a sliding door type shutter (for example, two substantially straight-edged lateral shutters configured to meet at the center of each hole to close the hole).

FIG. 1 is a flowchart showing an example process flow 100, according to some embodiments of the present disclosure described herein. During a priming operation 105, a primer material, such as hexamethyldisilazane (HDMS), is deposited onto a wafer (for example, by spin-casting). After the spin-casting operation, the wafer is subjected to a cooling operation 110 (for example, by placing the wafer onto a cooling plate). After the cooling operation 110, the primed wafer can be coated with a material-such as a photoresist-during a coating operation 115.

In some embodiments of the present disclosure, the material used in the coating operations is a polymeric material deposited from a polymer solution dispersed in an organic solvent. During deposition (for example, spin coating, dip coating, or the like), volatile organic compounds (VOCs) can evaporate and propagate throughout a deposition chamber, resulting in a solvent exhaust. Additionally, in some embodiments of the present disclosure, solvent evaporation can be the beginning of a curing process where polymer films having a substantially uniform thickness across the entire area of the wafer (for example, a substrate) that is free of defects. In some embodiments of the present disclosure, removal of the solvent exhaust can be used to control the drying and/or curing characteristics of the polymer film.

In some embodiments of the present disclosure, a dispensing and coating chamber can have an exhaust system flowably coupled to the chamber. For example, the chamber can be a production-level photoresist coating tool, a laboratory fume hood, a glove box, or the like. In some embodiments of the present disclosure, an exhaust system port can be positioned above a dispenser nozzle and the wafer being coated.

Figure 2:
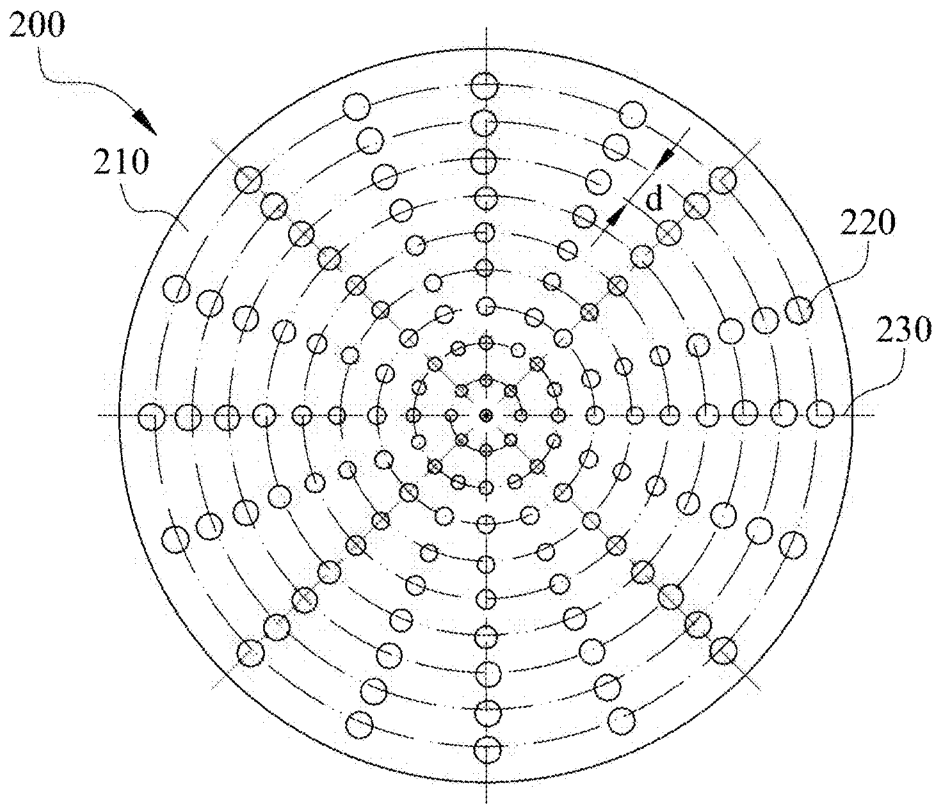
FIG. 2 is a top view of a perforated plate, in accordance with some embodiments.

Referring now to FIG. 2, a perforated plate 200 can be positioned adjacent to the exhaust system port such that the perforated plate 200 is between the exhaust system port and the wafer. In some embodiments of the present disclosure, the perforated plate 200 can be flowably connected to the exhaust system port. As shown in FIG. 2, the perforated plate 200 includes a platen 210 with a plurality of exhaust holes 220 extending radially from the center of the platen 210. In some embodiments of the present disclosure, the exhaust holes 220 can form concentric rings around the center of the platen 210, the concentric rings separated by a distance d. In some embodiments of the present disclosure, distance d represents the spacing from the center of a first hole 220 to the center of a second hole 220 along a radial line 230. Distance d can be about 3 mm, about 4 mm, about 5 mm, about 10 mm, about 15 mm, about 20 mm, about 30 mm, or any suitable distance as desired and/or possible. For example, iris shutter placement can determine a proximity of a first hole 220 to a second hole 220. Also shown in FIG. 2, the exhaust holes 220 can have different diameters based on placement of the exhaust holes 220 along a radial line 230. For example, exhaust holes 220 positioned closer to the center of the platen 210 can have a smaller diameter than exhaust holes 220 positioned closer to the edge of the platen 210.

In some embodiments of the present disclosure, the platen 210 can have a hole area ratio ranging from about 0.19 to about 0.22. In some embodiments, the hole area ratio is a ratio between the overall area of the platen 210 to the combined area of the open holes 220. For example, a platen 210 having an area of 7.07 $cm^2$ having an open hole total area of 1.43 $cm^2$ can have a hole area ratio of about 0.2. Examples of platen 210 and hole 220 characteristics are shown in Table 1 below.

TABLE 1

| Sample No. | Platen Radius (cm) | Platen Area ($cm^2$) | Quantity of Holes | Iris Size (cm) | Hole Radius (cm) | Hole Diameter (cm) | Hole Area ($cm^2$) | Hole Density ($cm^{-2}$) | Hole Area Ratio |
|---|---|---|---|---|---|---|---|---|---|
| 1 | 1.5 | 7.07 | 9 | 0.5 | 0.225 | 0.45 | 1.43 | 1.27 | 0.2 |
| 2 | 3 | 28.26 | 25 | 0.6 | 0.27 | 0.54 | 5.72 | 0.88 | 0.2 |
| 3 | 4.5 | 63.59 | 41 | 0.71 | 0.32 | 0.64 | 13.18 | 0.64 | 0.21 |
| 4 | 6 | 113.04 | 57 | 0.78 | 0.35 | 0.7 | 21.93 | 0.5 | 0.19 |
| 5 | 7.5 | 176.63 | 73 | 0.89 | 0.4 | 0.8 | 36.68 | 0.41 | 0.21 |
| 6 | 9 | 254.34 | 89 | 1 | 0.45 | 0.9 | 56.59 | 0.35 | 0.22 |
| 7 | 10.5 | 346.19 | 105 | 1 | 0.45 | 0.9 | 66.76 | 0.3 | 0.19 |
| 8 | 12 | 452.16 | 121 | 1.11 | 0.5 | 1 | 94.99 | 0.27 | 0.21 |
| 9 | 13.5 | 572.27 | 137 | 1.11 | 0.5 | 1 | 107.55 | 0.24 | 0.19 |

In some embodiments of the present disclosure, the holes 220 can have a diameter from about 500 μm to about 50 mm. For example, the hole 220 diameter can be about 500 μm, about 600 μm, about 700 μm, about 800 μm, about 900 μm, about 1 mm, about 2 mm, about 3 mm, about 4 mm, about 5 mm, about 6 mm, about 7 mm, about 8 mm, about 9 mm, about 10 mm, about 11 mm, about 12 mm, about 13 mm, about 14 mm, about 15 mm, about 16 mm, about 17 mm, about 18 mm, about 19 mm, about 20 mm, about 25 mm, about 30 mm, about 35 mm, about 40 mm, about 45 mm, or about 50 mm. In some embodiments of the present disclosure, the diameter of the holes can be from about 0.1% to about 10% of the diameter of the perforated plate. For example, the diameter of the holes can be about 0.1%, about 0.2%, about 0.3%, about 0.4%, about 0.5%, about 0.6%, about 0.7%, about 0.8%, about 0.9%, about 1%, about 2%, about 3%, about 4%, about 5%, about 6%, about 7%, about 8%, about 9%, or about 10% of the diameter of the perforated plate.

Figure 3A:
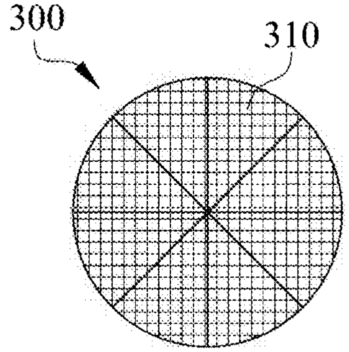
FIGS. 3A-3C are top views of a shutter, in accordance with some embodiments.
Figure 3B:
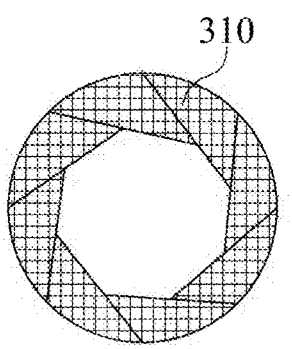
Figure 3C:
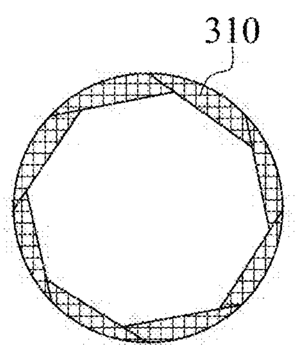

In some embodiments of the present disclosure, controlling the removal of the solvent exhaust can be performed by controlling the open diameter of the exhaust holes 220. Referring now to FIGS. 3A-3C, each exhaust hole 220 can include a shutter 300. In some embodiments of the present disclosure, the shutter 300 is an iris shutter including a plurality of blades 310. The blades 310 extend from the outer edges of the exhaust holes 220 to the center of the exhaust holes 220 when in a closed configuration, as shown in FIG. 3A. FIG. 3B shows a partially open configuration, providing an opening of from about 1% to about 99% of the diameter of the exhaust hole 220. In some embodiments, FIG. 3C shows an iris shutter providing an opening of about 80% of the diameter of the exhaust hole. In some embodiments of the present disclosure, about 80% of the diameter of the exhaust hole 220 can be considered to be a fully-open configuration, depending on the incorporation of the shutter 300. For example, when the shutter 300 is placed within the platen 210, the iris blades 310 may not be able to fully retract into the platen 210, thus the shutter 300 can be in a fully open configuration although unable to expose the entire exhaust hole 220. In some embodiments of the present disclosure, when the shutter 300 is positioned on the platen 210 and adjacent to the exhaust hole 220, the shutter 300 can be configured to open to about 100% of the diameter of the exhaust hole 220.

In some embodiments of the present disclosure, controlling solvent removal from a material dispensing operation (for example, the priming operation 105, the coating operation 115 and/or the solvent rinsing operation 145 shown in FIG. 1) can provide a substantially uniform and a substantially consistent thin film. For example, spin coating and/or dip coating a thin film material onto a substrate (for example, a wafer) can be performed by dissolving a material into a solution, dispensing the material solution onto the substrate, and spinning the substrate to provide a material thin film. During the spinning operation, solvent from the material solution can evaporate as a process exhaust. In some embodiments of the present disclosure, the perforated plate 200 can be positioned adjacent to or above a spin coater.

Figure 4:
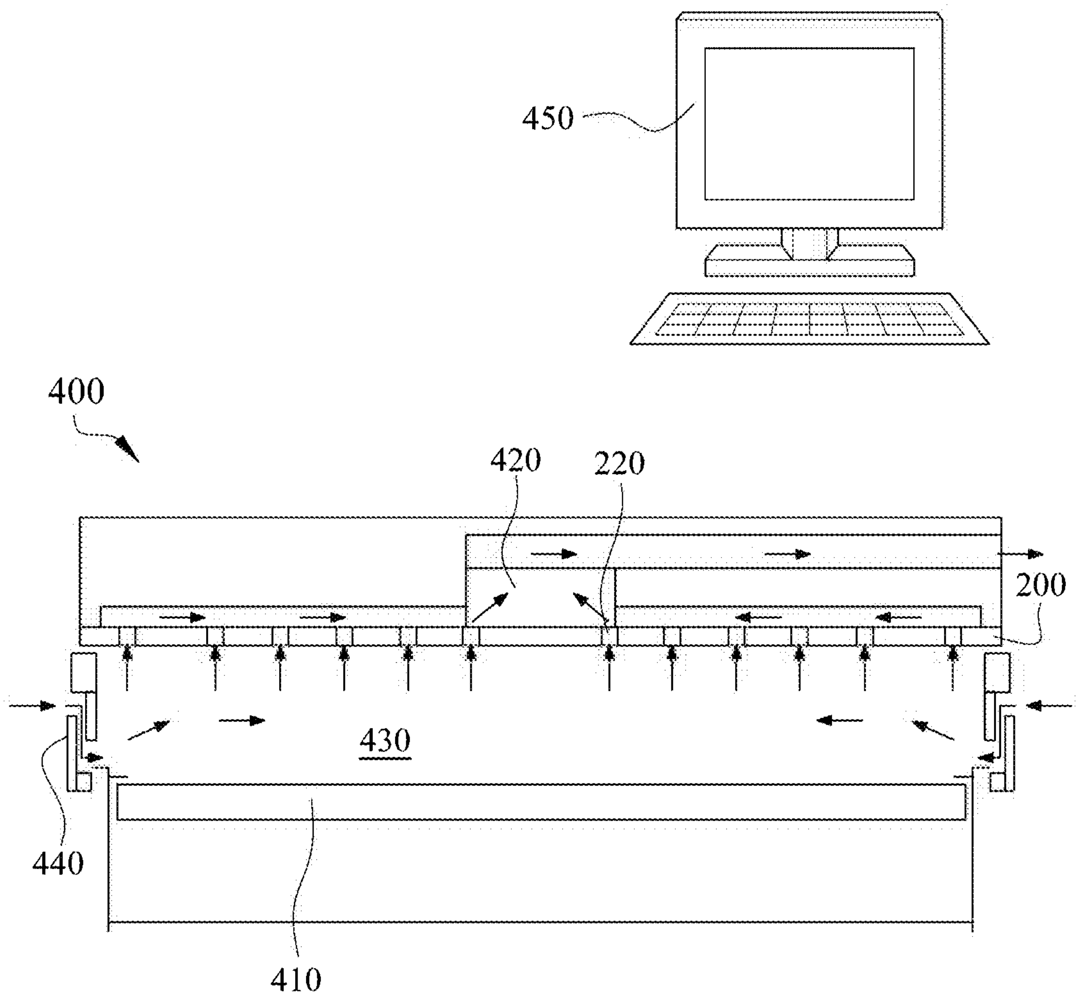
FIG. 4 is a schematic showing a perforated plate in a process tool, in accordance with some embodiments.

FIG. 4 shows placement of the perforated plate 200, according to some embodiments of the present disclosure. The perforated plate 200 can be positioned inside the process tool 400, between the process tool 400 and the exhaust port 420, or within the exhaust port 420. A process tool 400 can receive a substrate 410 (for example, a wafer) for processing (for example, coating, curing, or the like). The process tool 400 can include an exhaust port 420 configured to draw solvent and other chemical exhaust from the process tool 400. Directional arrows in FIG. 4 depict an example exhaust flow. In some embodiments of the present disclosure, exhaust occurring in a chamber 430 of the process tool 400 can be flowably controlled using the perforated plate 200. In some embodiments of the present disclosure, each exhaust hole 220 of the perforated plate 200 can be individually opened, closed, or partially opened using a control system 450 (e.g., a computing device, a controller device, or a processing device) to regulate the exhaust gas flow from the chamber 430 to the exhaust port 420. A ring shutter 440 can be used to enclose the chamber 430. In some embodiments of the present disclosure, a control system 450 can be employed to control each shutter 300 associated with each hole 220 across the perforated plate 200.

In some embodiments of the present disclosure, solvent exhaust can be generated during a baking operation (for example, Heating operation 120, Heating operation 135, and/or Heating operation 150 of FIG. 1). For example, a Si wafer can be coated with a positive photoresist thin film. To prepare the positive photoresist thin film for subsequent downstream processing (for example, exposure (Irradiating operation 130 of FIG. 1), hard baking (Heating operation 135 and Cooling operation 140 of FIG. 1), and developing (Solvent Rinsing operation of FIG. 1)). In some embodiments of the present disclosure, the coated Si wafer is placed onto a hot plate to cure the positive photoresist thin film, for example, remaining solvent is heated and driven out of the positive photoresist thin film by evaporation. The evaporated solvent becomes the solvent exhaust that can be controllably and safely removed from the environment using an exhaust system and the perforated plate 200. In some embodiments of the present disclosure, the exhaust system port 420 can be positioned above the Si wafer (for example, the substrate 410), and the perforated plate 200 can be positioned between the Si wafer and the exhaust system port 420. The solvent exhaust (indicated by directional arrows in FIG. 4) can be controllably and safely removed from the chamber 430. Controllable solvent exhaust removal is discussed in further detail below.

FIGS. 5A-5F is a collection of heat maps illustrating the effect of controlled exhaust flow on thin film characteristics, according to some embodiments of the present disclosure. In each of FIGS. 5A-5F, the top image shows the configuration of the perforated plate 200 during the experiment. The bottom image in each of FIG. 5A-5F shows a critical dimension uniformity heat map. Higher points (for example, thicker film areas) across the thin film are indicated by white (for example, white represents thin films having a thickness of greater than about 3.3 μm). Lower areas, for example thinner film areas, are indicated as black (for example, films having a thickness of up to about 3.175 μm).

In some embodiments of the present disclosure, the amount of exhaust flowing through the center of the perforated plate 200 can affect the critical dimension uniformity of the deposited thin film. As shown in FIGS. 5A-5F, varying the amount of exhaust flowing through the center of the perforated plate 200 can have significant effects on thin film uniformity across the substrate. For example, heat map A shows variation in the critical dimension uniformity when all exhaust holes 220 are fully open (for example, the shutter 300 is exposing at least about 80% of each exhaust hole 220). Heat maps B-F show varying critical dimension uniformity with an increasing center sealed diameter on the perforated plate 200. For example, heat map B shows the critical dimension uniformity when a 30 mm diameter center seal 510 is used. Heat map C shows the effect of a 60 mm diameter center seal 510, heat map D shows the effect of a 90 mm diameter center seal 510, heat map E show the effect of a 120 mm diameter center seal 510, and heat map F shows the effect of a 150 mm diameter center seal 510. Accordingly, the remainder of the exhaust holes 220 remain in the open configuration.

Figure 5A:
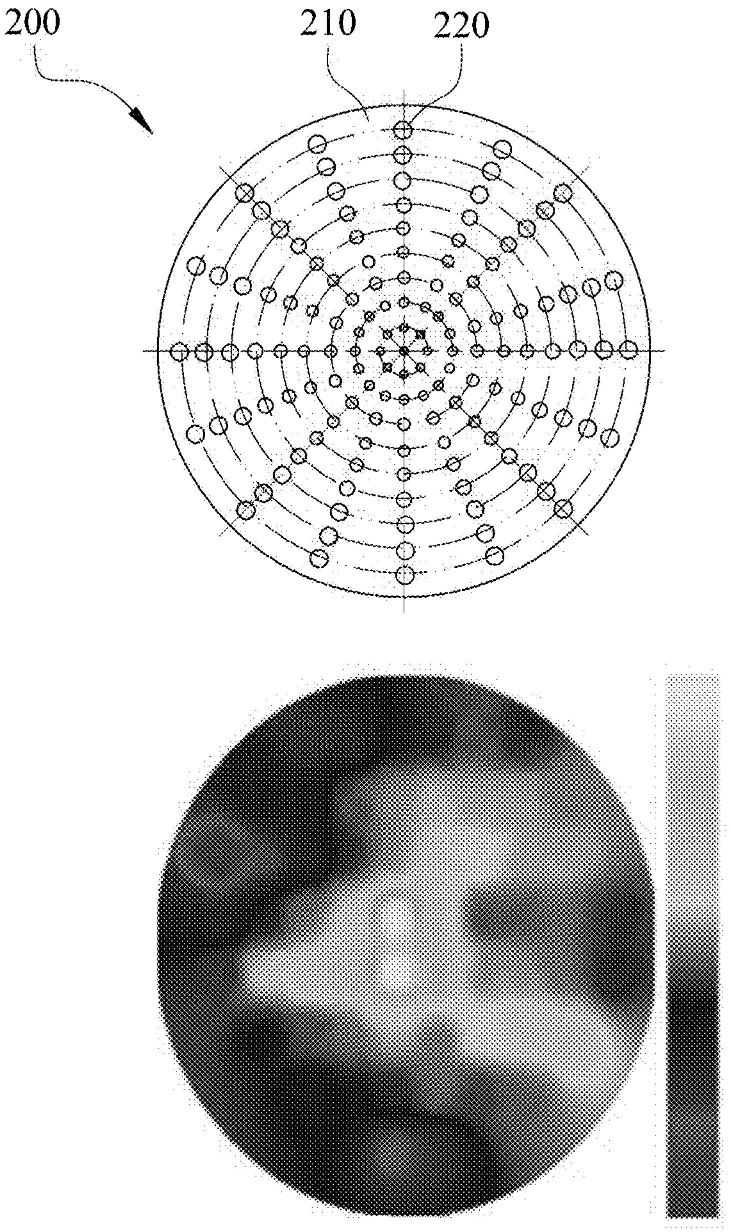
FIGS. 5A-5F are exhaust removal heat maps, in accordance with some embodiments.
Figure 5B:
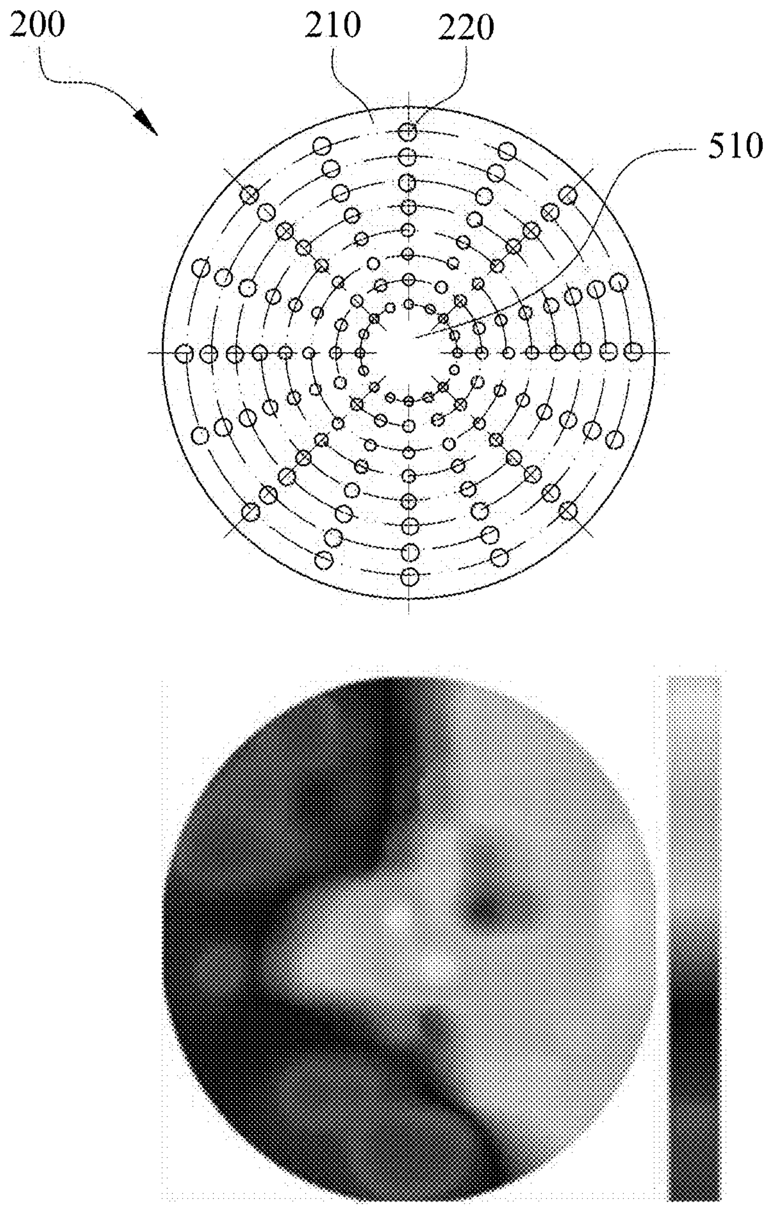
Figure 5C:
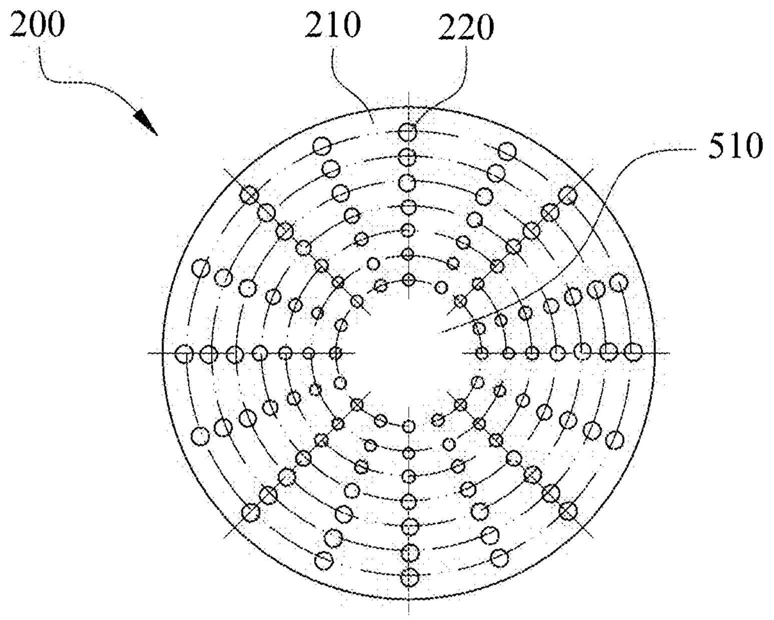
Figure 5C:
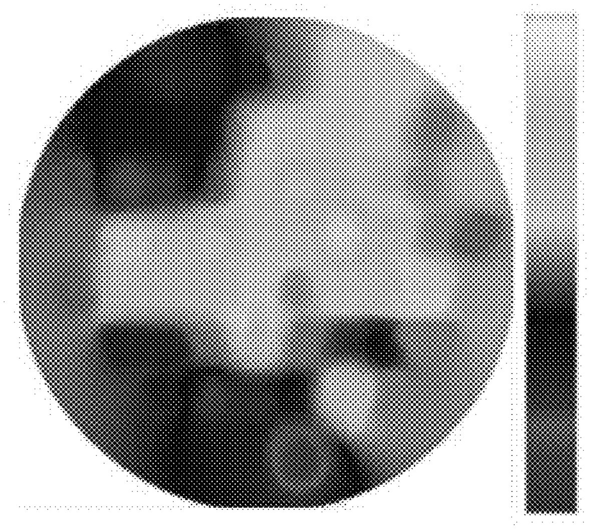
Figure 5D:
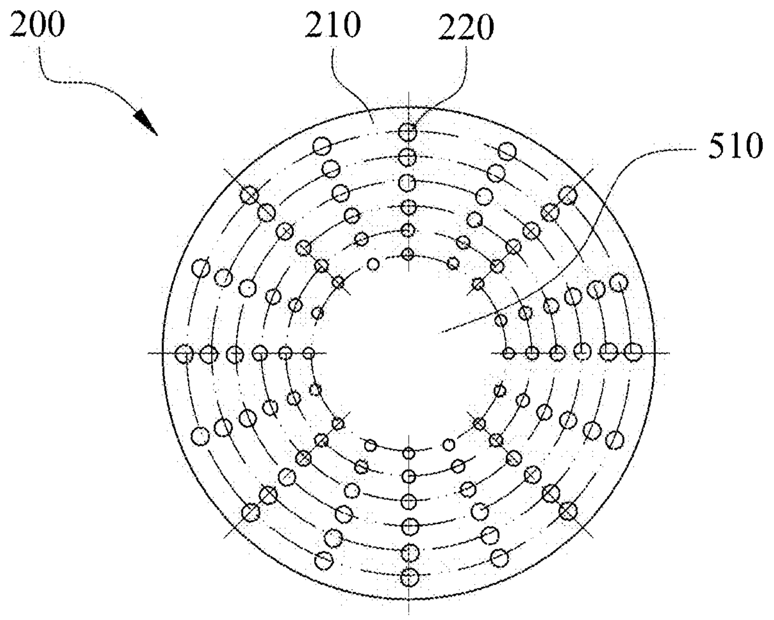
Figure 5D:
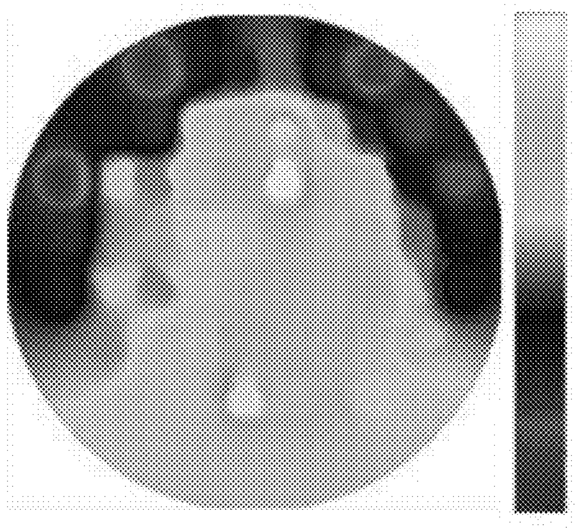
Figure 5E:
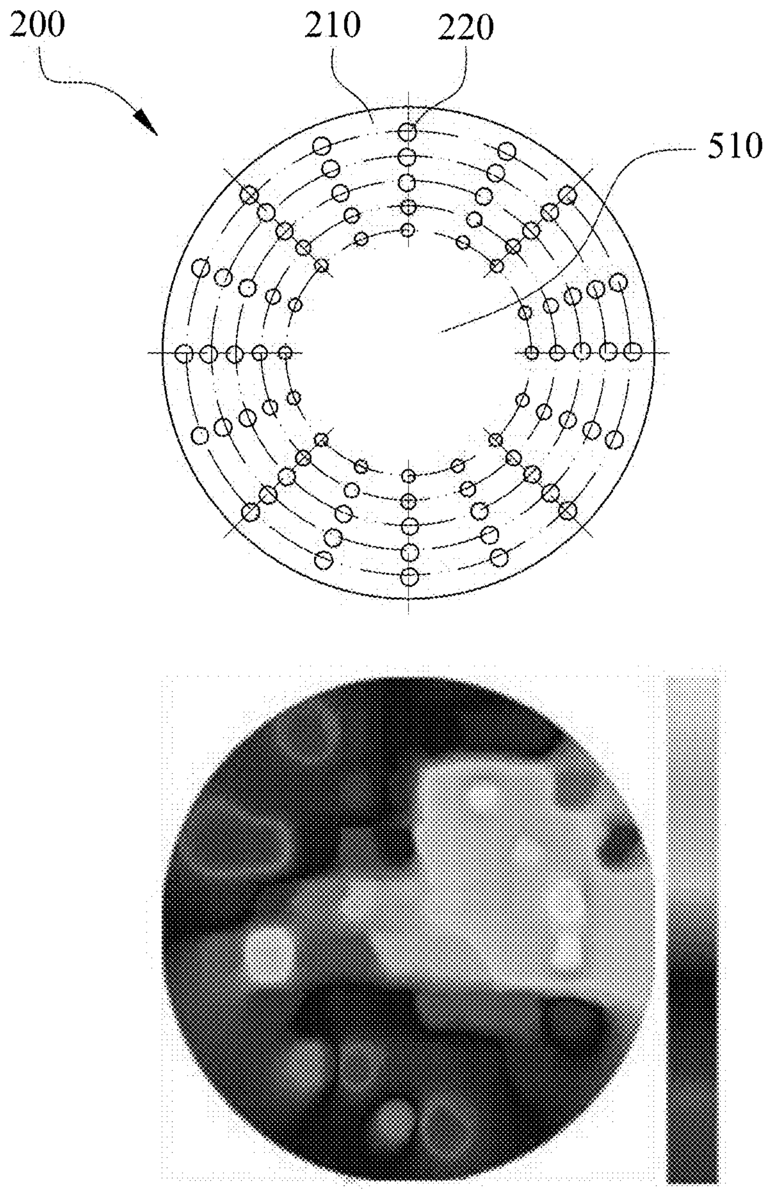
Figure 5F:
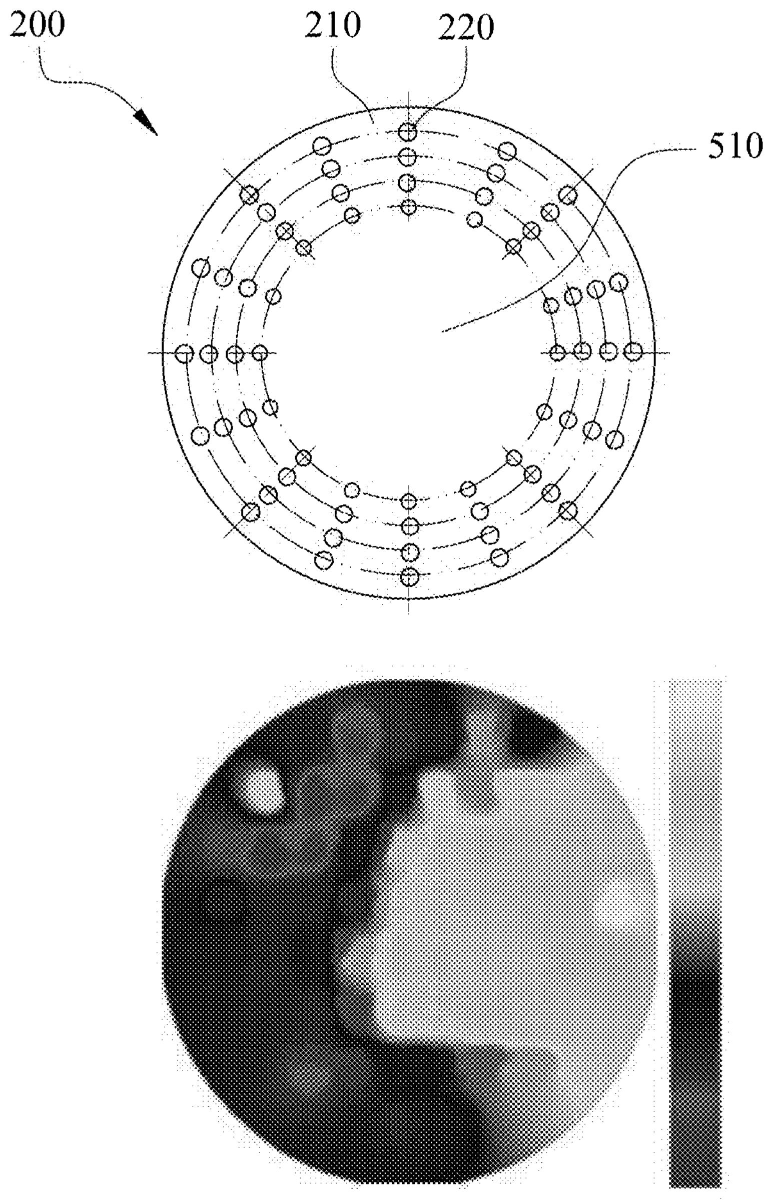

In some embodiments of the present disclosure, creating a center seal 510 with a diameter of 90 mm when depositing a thin film on a 300 mm substrate (for example, a 300 mm wafer) provides a substantially uniform and a substantially consistent thin film. As shown in FIG. 5D, when the perforated plate 200 is operated with a 90 mm diameter center seal 510, the resulting thin film is substantially uniform and substantially free of defects (for example, the heat map in FIG. 5D). Thus, preventing exhaust flow from being removed from a central area of the substrate and enabling exhaust flow from areas closer to the perimeter of the substrate can balance solvent exhaust removal from the thin film and provide a substantially uniform thin film on the substrate. In some embodiments of the present disclosure, the center seal 510 can be created using the shutters 300 coupled to the central exhaust holes 220. In some embodiments of the present disclosure, a physical attachment (for example, a sticker) can be used to provide the center seal 510. In some embodiments of the present disclosure, the sticker can be aluminum, copper, silver, or gold with a thickness from about 0.03 mm to about 0.3 mm.

In some embodiments of the present disclosure, a soft bake is performed after spin coating to drive residual solvent from the thin film and/or to at least partially cure the film after coating (FIG. 1, Heating operation 120 and Cooling operation 125). For example, certain types of photoresist material can be partially cured to allow for exposure (FIG. 1, Irradiating operation 130, Heating operation 135, and Cooling operation 140) and development (FIG. 1, Solvent Rinsing operation 145) while maintaining adhesion in areas that are not exposed and undeveloped (for example, when using a positive resist). As a result, the thin film surface profile can be controlled by controlling the exhaust removal from a soft bake process tool.

In some embodiments of the present disclosure, a hard bake, as shown in FIG. 1 at Heating operation 135, Cooling operation 140, Heating operation 150, and Cooling operation 155 can be performed to fully cure a thin polymer film to provide, for example, a hard mask for subsequent etching operations (for example, wet etching and/or dry etching), an etch stop layer, a dielectric layer, a protective layer, or the like. Controlling the surface profile of the deposited film can provide a template for subsequent processing operations. For example, controlled solvent exhaust removal can provide tailored thin films having varying thicknesses amenable to providing tailored etch profiles. In some embodiments of the present disclosure, controlled exhaust removal can provide a cured thin film with varying film thickness across the substrate. During a subsequent etching operation, where a uniform etching recipe is used, areas masked with a thicker thin film mask will etch slower than areas with a thinner thin film mask.

Referring now to FIGS. 6A-6E, after a baking process to remove residual solvent and cure the film, thin film surface profiles corresponding to the open and closed patterns of the holes 220 in the perforated plate 200. In some embodiments of the present disclosure, the FIGS. 6A-6E inset shows the condition of each hole 220 in the plurality of holes during the solvent bake. The inset shows a closed hole 610, a partially open hole 620, and an open hole 630. The inset indicators correspond to the top image in each of FIGS. 6A-6E showing the configuration of the perforated plate 200 during each experiment.

Figure 6A:
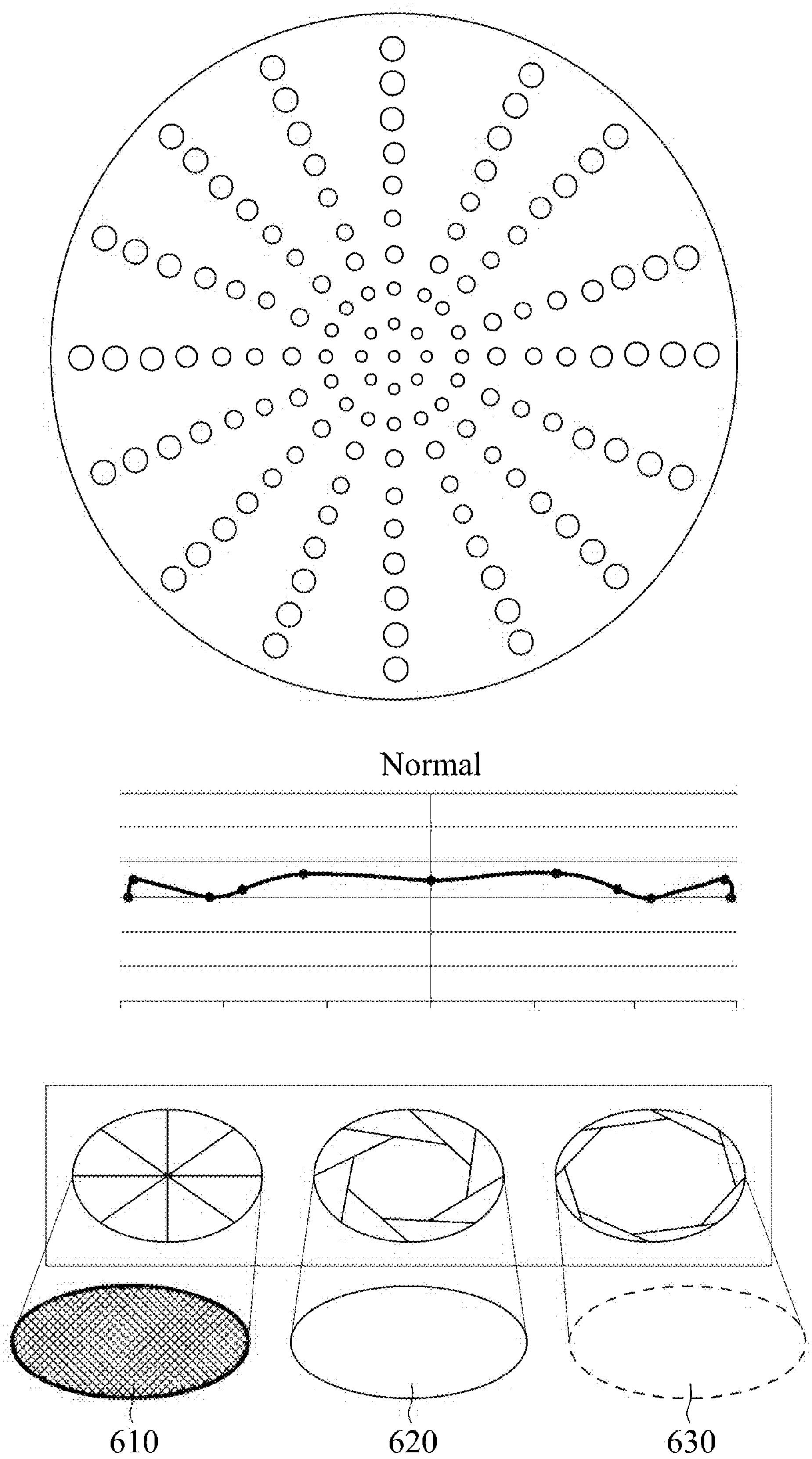
FIGS. 6A-6E are cured material surface profiles, in accordance with some embodiments.

FIG. 6A shows the resulting thin film having a substantially uniform surface profile, (referred to herein as “Normal” in FIG. 6A), provided when all exhaust holes 220 in the plurality of exhaust holes are at least partially open. A thin polymer film is spin-cast onto the substrate 410 and the substrate 410 undergoes a bake. The thin polymer film is profiled, and the deposited film exhibits a substantially uniform film thickness across the diameter of the substrate 410. In some embodiments of the present disclosure, when the exhaust is uniformly removed from the chamber 430, the deposited thin film can have a substantially uniform surface profile.

Figure 6B:
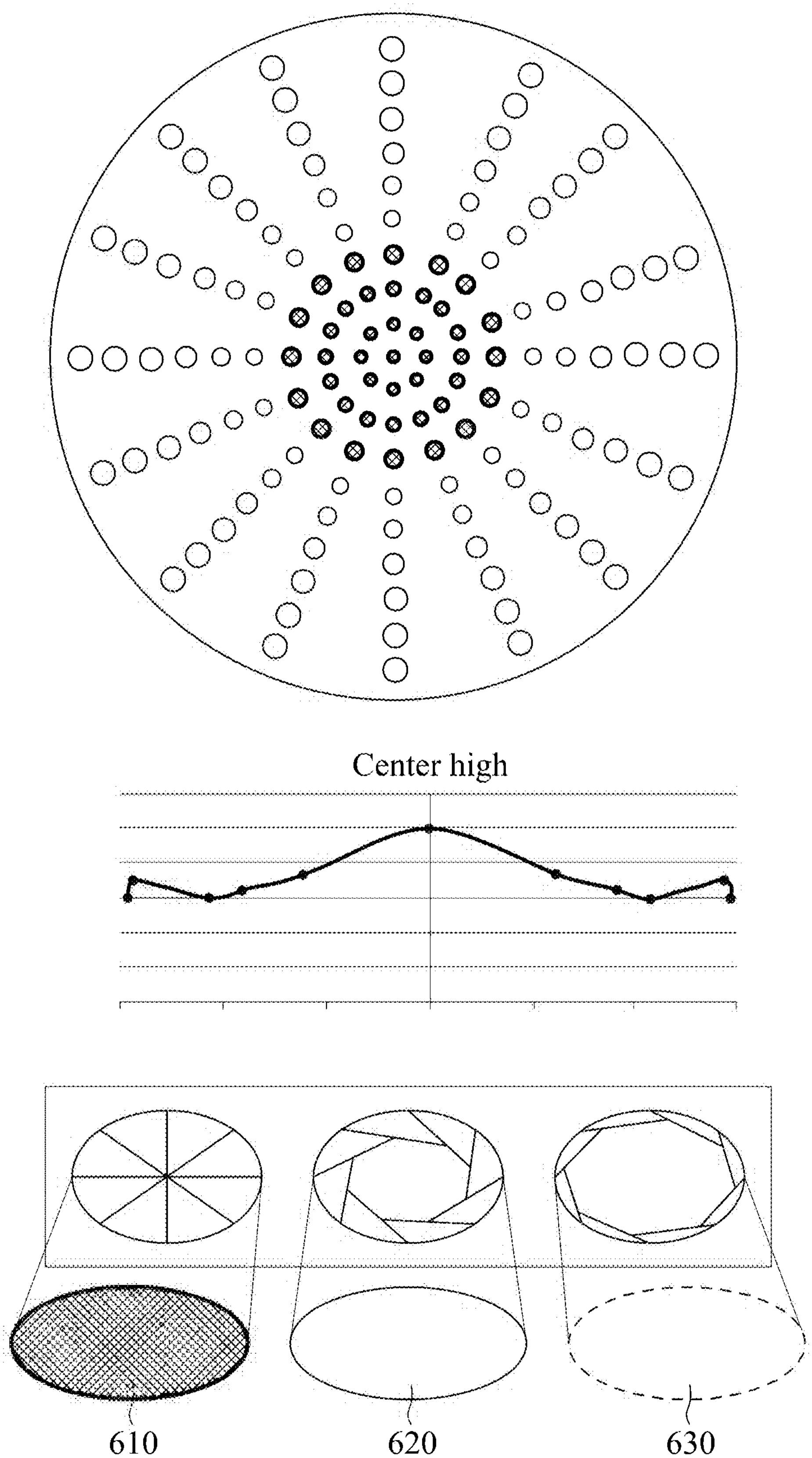

In some embodiments of the present disclosure, exhaust removal can be controlled to provide a tailored thin film surface profile. For example, when a center area of the perforated plate 200 is closed, solvent exhaust removal is slowed over the center of the substrate, providing a thin film with a thicker profile (for example, a solvent-rich area) under the closed exhaust holes 220. Likewise, where solvent exhaust removal is not inhibited (for example, toward the perimeter of the perforated plate 200 where the exhaust holes 220 are in an open configuration), the solvent is withdrawn from the deposited film at a higher rate than at the center, allowing the polymer to cure faster leaving a thinner film than where the exhaust holes 220 were closed (for example, a solvent-poor area). As shown in FIG. 6B (for example, in the "Center high" example), the thin film can be provided with a thicker center area compared to the film across the remainder of the substrate when the central holes 220 are closed and outer holes 220 are open.

Figure 6C:
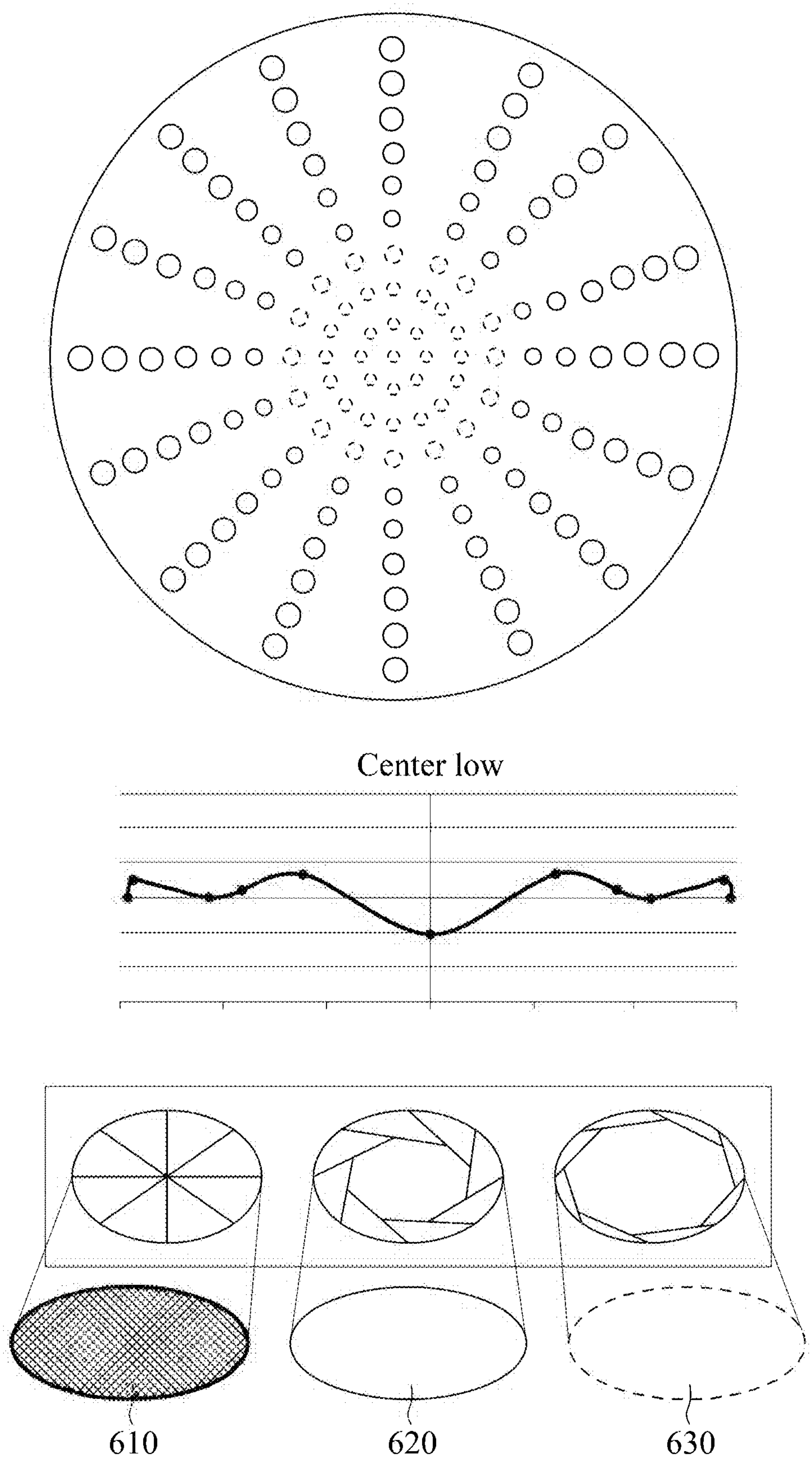
Figure 6D:
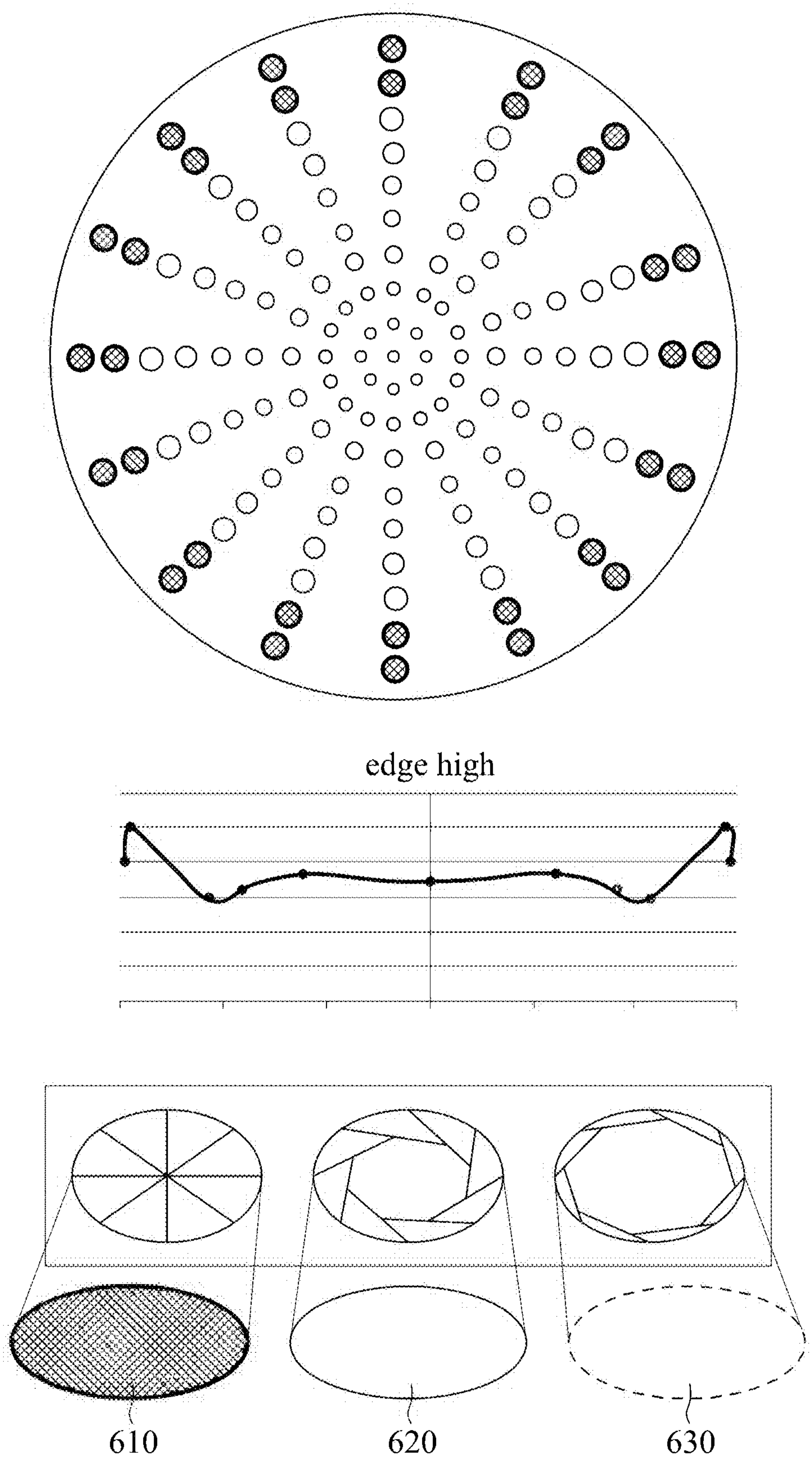
Figure 6E:
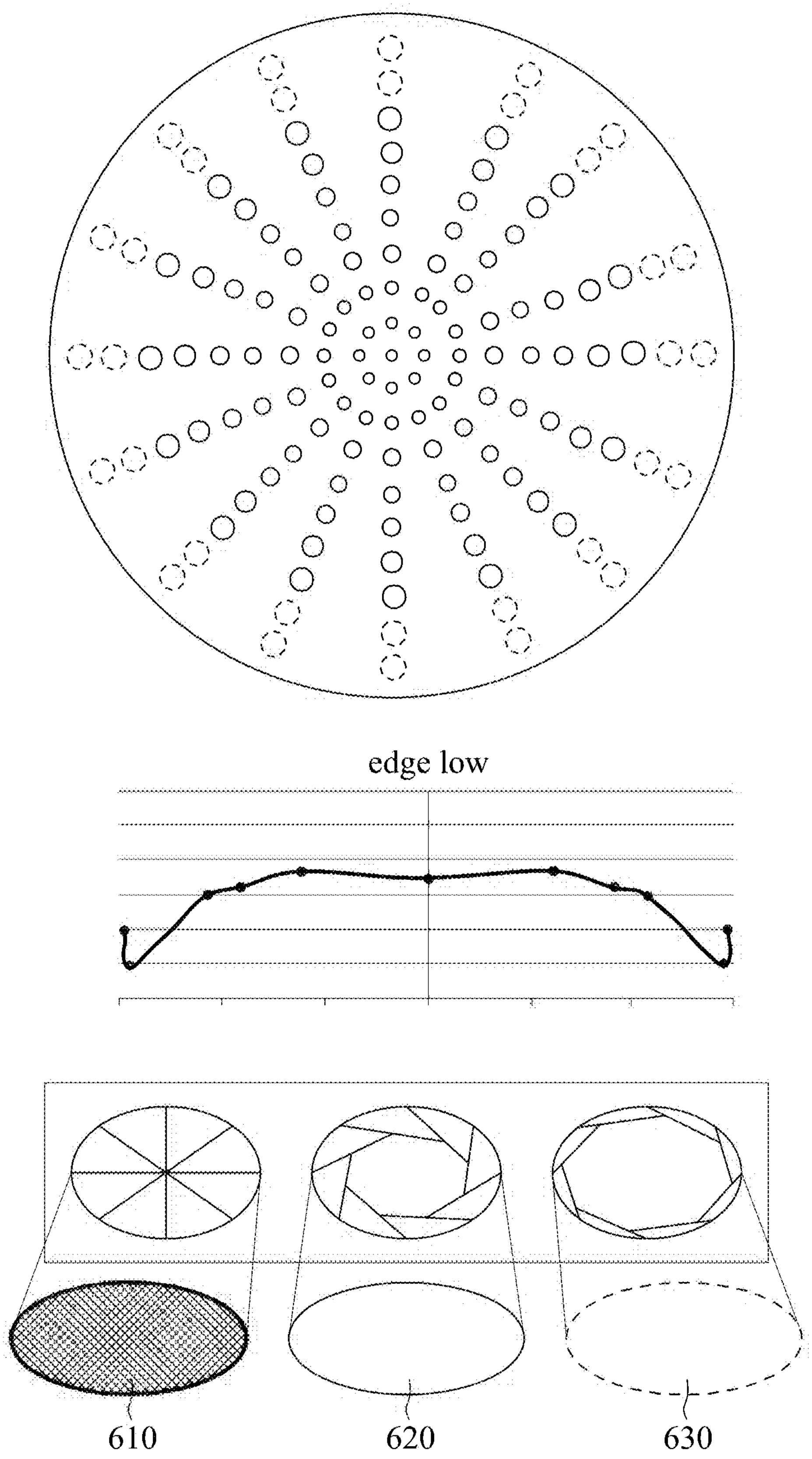

Further, in some embodiments of the present disclosure, the deposited thin films can be provided having any desired annular surface profile. As shown in FIG. 6C, where the exhaust holes 220 closer to the center of the perforated plate 200 are in a fully open configuration and the exhaust holes 220 arranged around the fully open center section are at least partially opened, the thin film can be provided having a thinner center area and thicker outer regions (also referred to herein as "Center low" in the example of FIG. 6C). Likewise, the thin film can be provided having a thick edge profile and a substantially uniform central profile, as depicted in FIG. 6D (also referred to herein as "edge high"), where outer holes 220 are closed and central holes 220 are at least partially open. Also, a thin edge profile and a substantially uniform central profile (also referred to herein as "edge low") can be provided as shown in FIG. 6E when outer holes 220 are fully open and central holes 220 are at least partially opened.

In some embodiments of the present disclosure, the perforated plate 200 can be deployed in any suitable chemical processing tool. For example, the perforated plate 200 can be used in a process tool used to develop exposed photoresist (for example, Solvent Rinsing operation 145 in FIG. 1). The photoresist developer can be a solvent having hazardous exhaust that needs to be controllably removed. In some embodiments of the present disclosure, using the perforated plate 200 in a development tool can provide a controlled photoresist development. For example, a high exhaust flow can be provided by opening the exhaust holes 220 over a certain area of the substrate and photoresist being developed. The faster exhaust draw can accelerate the solvent volatility and provide a partially developed photoresist layer, further providing a partially masked area of the substrate. In some embodiments of the present disclosure, a partially masked area can be used to create a tailored etch profile in downstream processing.

Figure 7A:
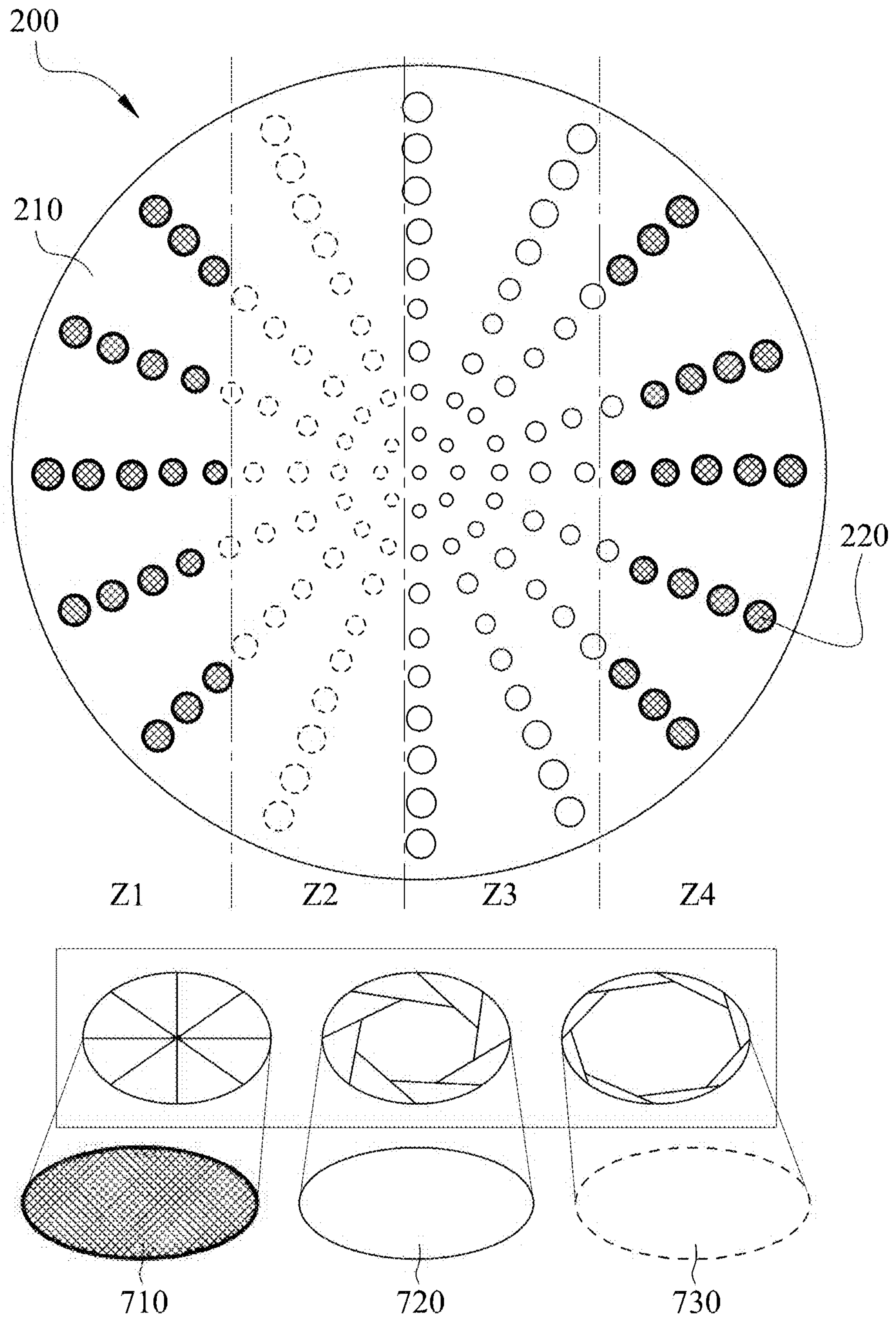
FIGS. 7A and 7B are top views of a perforated plate, in accordance with some embodiments.
Figure 7B:
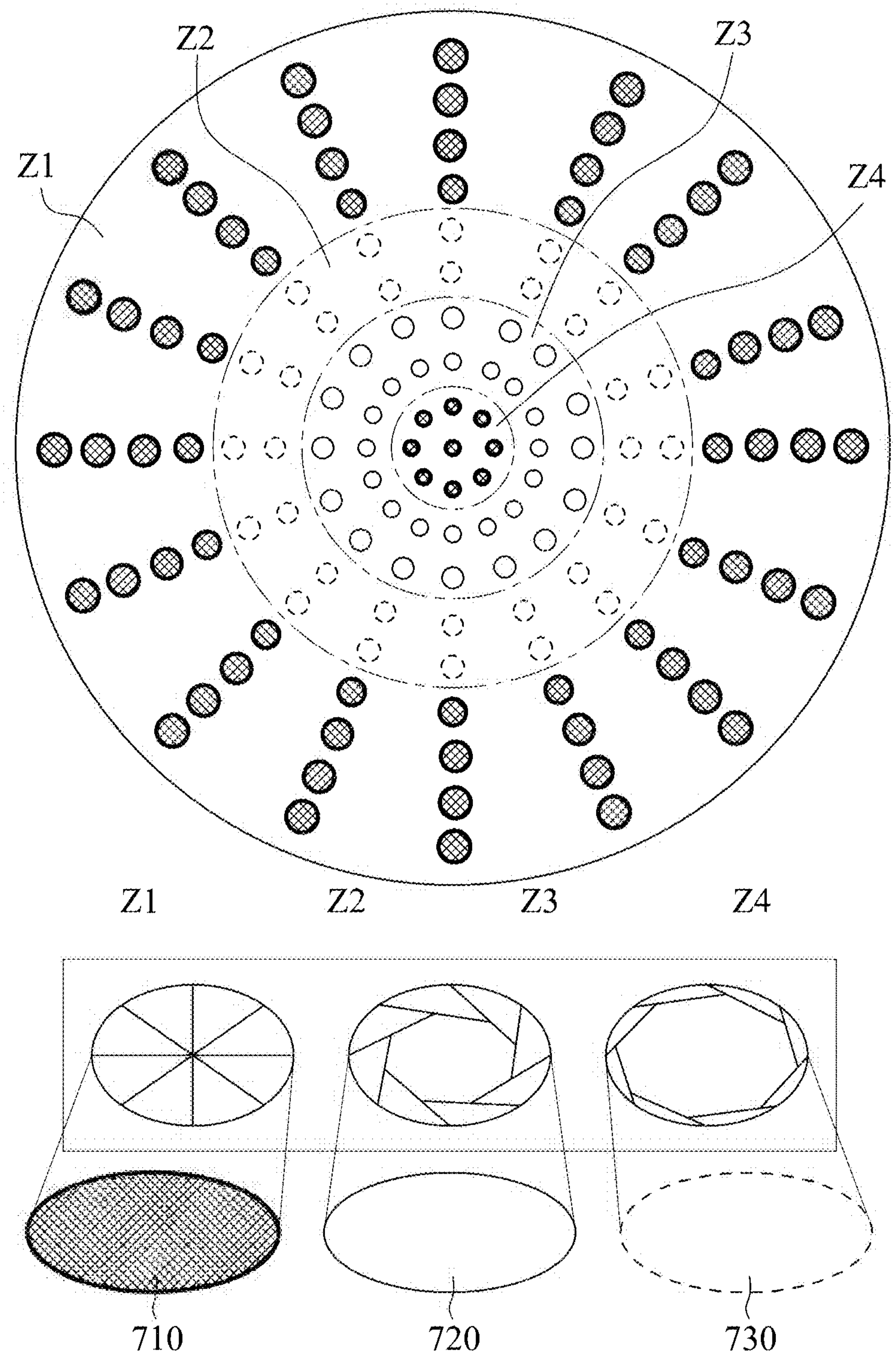

In some embodiments of the present disclosure, each exhaust hole 220 in the plurality of exhaust holes arranged radially concentric across the perforated plate 200 is individually controllable (e.g., open, closed, or partially opened). In some embodiments of the present disclosure, the perforated plate 200 can be a process tool exhaust distribution plate. As described above, distributing the exhaust (for example, solvent exhaust) from a thin film processing tool can provide a substantially uniform and a substantially consistent thin film across the substrate 410. Optionally, distributing the exhaust can provide a tailored thin film as shown in FIGS. 6A-6E. As shown in FIGS. 7A and 7B, each exhaust hole 220 can be open 730, partially open 720, and/or closed 710. In some embodiments of the present disclosure, FIG. 7A shows a non-radial pattern of open 730, partially open 720, and closed 710 exhaust holes 220. Individually controllable shutters 300 provide any desired exhaust removal pattern. For example, the perforated plate 200 can be used to provide varied exhaust removal zones across the area of the perforated plate 200. The exhaust removal zones can be determined by prescribable recipes input to the control system 450 (of FIG. 4), further described below. As shown in FIG. 7A, in some embodiments of the present disclosure, a variable thickness thin film can be provided by programming a pattern that divides the perforated plate 200 into four zones, Z1, Z2, Z3, and Z4. In some embodiments of the present disclosure, the left zone Z1 can provide a thicker thin film, the second from the left zone Z2 can provide a thinner film, the third from the left zone Z3 can provide an intermediate thickness zone, and the right side zone Z4 can provide a thicker right zone.

FIG. 7B shows an optional exhaust removal pattern. In some embodiments of the present disclosure, the exhaust holes 220 can be alternatively closed 710, partially open 720, or open 730 as desired based on desired thin film characteristics (for example, critical dimension uniformity and/or surface profile). In some embodiments of the present disclosure, the zones defined can provide a circular ripple pattern in a cured thin film having a thick center (zone Z4), a less thick first concentric area around the center (zone Z3), a thin concentric area adjacent to the less thick area (zone Z2), and a thick outer ring (zone Z1).

In some embodiments of the present disclosure, described herein is a method 800 of removing exhaust from a processing system. For example, the method 800 describes removing chemical exhaust from a chemical processing tool. For illustrative purposes, the operations of method 800 will be described with reference to FIGS. 2 and 4. The operations of method 800 can be performed in a different order or not performed depending on specific applications. Further, it is understood that additional operations can be provided before, during, and after method 800, and that other operations may only be briefly described herein.

At operation 810, an exhaust removal port of an exhaust removal system is positioned adjacent to the process tool. Referring back to FIG. 4, the exhaust port 420 can be positioned above the substrate 410. The process tool 400 can be an enclosed system or an open system. In some examples, the enclosed system can have the chamber 430 (for example, a reaction chamber, a vacuum chamber, a spray chamber, or the like) that can further be enclosed for processing (for example, using the ring shutter 440). The chemical processing tool can be a wet chemical processing tool, a dry chemical processing tool, a laboratory bench, a glove box, and/or a fume hood.

In some embodiments of the present disclosure, the process tool 400 is a chemical dispenser, a chemical curing system, a soft baking system, a hard baking system, a solvent rinsing system, a chemical mechanical planarization (CMP) system, or any suitable chemical processing system.

Figure 8:
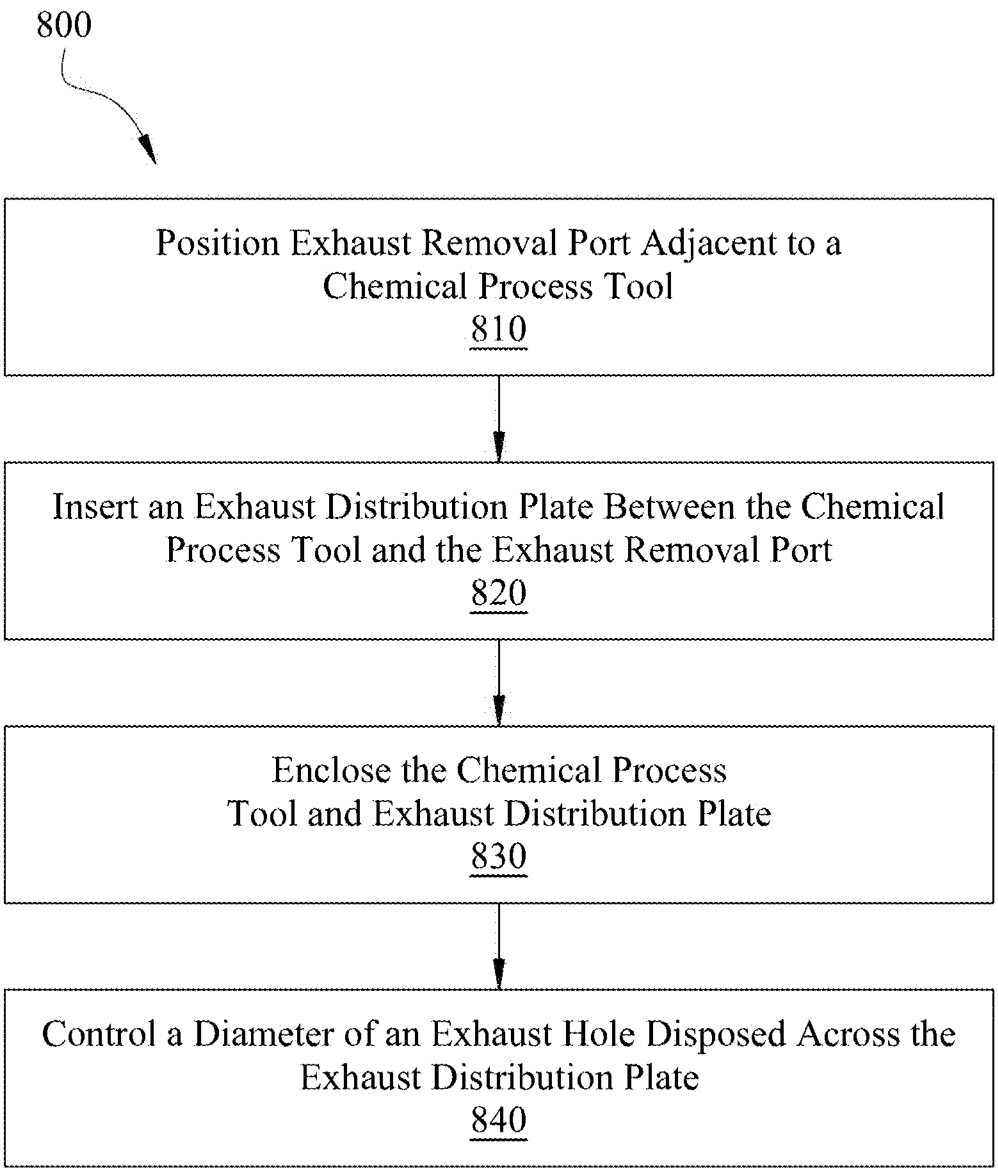
FIG. 8 is a flowchart for a method of deploying a perforated plate, in accordance with some embodiments.

Referring to FIG. 8, at operation 820, an exhaust distribution plate (for example, the perforated plate 200 in FIG. 4) is inserted between the process tool 400 and the exhaust removal port. The exhaust distribution plate can be inserted into a slot positioned around and in front of the exhaust removal port. The slot can be original to the exhaust removal port, or fabricated to receive the exhaust distribution plate. In some embodiments of the present disclosure, the exhaust distribution plate can have a free-standing base or frame to hold the exhaust distribution plate adjacent to the exhaust removal port. The free-standing base or frame can be separate from the exhaust removal port, the exhaust system, and/or the chemical processing tool.

Referring to FIG. 8, at operation 830, the process tool 400 and the exhaust distribution plate are enclosed to provide a controlled exhaust removal environment. Referring back to FIG. 4, the process tool 400 can be configured to receive the substrate 410 with the exhaust removal port 420 positioned above the substrate 410. The exhaust distribution plate (for example, the perforated plate 200) can be positioned between the exhaust removal port 420 and the substrate 410.

In some embodiments of the present disclosure, the chamber 430 can be enclosed to control exhaust flow (indicated by directional arrows in FIG. 4). In some cases, the ring shutter 440 can be employed to enclose the process tool 400 (for example, close the chamber 430). Once enclosed, the exhaust can flow through the exhaust distribution plate (for example, the perforated plate 200) and into the exhaust removal port 420.

Referring to FIG. 8, at operation 840, a diameter of each exhaust hole 220 in a plurality of exhaust holes disposed radially across the exhaust distribution plate is controlled. For example, the exhaust distribution plate can be communicably coupled to a control system 450 (for example, a programmable computer or a dedicated control device). The control system 450 can be configured to control the shutter 300 settings of each individual exhaust hole 220. As a result, the exhaust distribution plate can be controlled to impart a desired thin film surface profile, provide a high degree of critical dimension uniformity, and/or tailor other thin film characteristics based on downstream applications.

In some embodiments of the present disclosure, a processing system includes a stage configured to hold a substrate thereon and an exhaust system. The exhaust system can include a perforated plate with a plurality of exhaust holes and an exhaust port. The perforated plate can be positioned between the substrate and the exhaust port. In some embodiments of the present disclosure, each exhaust hole in the plurality of exhaust holes comprises a shutter.

In some embodiments of the present disclosure, a process tool exhaust distribution plate includes a plurality of exhaust holes disposed radially across the exhaust distribution plate. The exhaust distribution plate can include a plurality of shutters configured to adjust a diameter of an opening of each exhaust hole in the plurality of exhaust holes.

In some embodiments of the present disclosure, a method of removing exhaust from a processing system includes: positioning an exhaust removal port of an exhaust removal system adjacent to a chemical process tool; inserting an exhaust distribution plate between the chemical process tool and the exhaust removal port; enclosing the chemical process tool and the exhaust distribution plate to provide a controlled exhaust removal environment; and controlling a diameter of each exhaust hole in a plurality of exhaust holes disposed radially across the exhaust distribution plate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A processing system, comprising:

a stage configured to hold a substrate; and an exhaust system comprising a perforated plate with a plurality of exhaust holes, disposed radially across the perforated plate, and an exhaust port, wherein:

the perforated plate is positioned between the substrate and the exhaust port, and each exhaust hole in the plurality of exhaust holes comprises a shutter; and a control system configured to:

determine a non-radial exhaust removal pattern of open and closed exhaust holes from a non-radial exhaust removal profile, and control the shutter of each exhaust hole in the plurality of exhaust holes to produce the non-radial exhaust removal pattern.

2. The processing system of claim 1, wherein each exhaust hole in the plurality of exhaust holes is a circle of equal diameter.

3. The processing system of claim 1, wherein to be controlled, the shutter associated with each exhaust hole in the plurality of exhaust holes comprises an open configuration, a partially open configuration, or a closed configuration.

4. The processing system of claim 1, wherein the plurality of exhaust holes is arranged into zones distributed across the perforated plate.

5. The processing system of claim 4, wherein the zones are based on prescribable patterns of closed exhaust holes, partially opened exhaust holes, and open exhaust holes.

6. The processing system of claim 5, wherein the closed exhaust holes are 0% open, the open exhaust holes are about 80% open, and the partially opened holes are between 0% and about 80% open.

7. The processing system of claim 1, further comprising a dispenser positioned above the stage.

8. The processing system of claim 7, wherein the exhaust system is configured to remove exhaust from the dispenser.

9. The processing system of claim 1, further comprising a curing system configured to receive the stage and substrate.

10. The processing system of claim 9, wherein the exhaust system is configured to remove exhaust from the curing system.

11. The processing system of claim 1, wherein each shutter comprises an iris shutter.

12. A process tool exhaust distribution plate, comprising:

a plurality of exhaust holes disposed radially across the process tool exhaust distribution plate, wherein each exhaust hole of the plurality of exhaust holes comprises a shutter, wherein:

the shutter of each exhaust hole in the plurality of exhaust holes is configured to be controlled by a control system, and the control system is configured to:

determine a non-radial exhaust removal pattern of open and closed exhaust holes from a non-radial exhaust removal profile; and control the shutter of each exhaust hole in the plurality of exhaust holes to produce the non-radial exhaust removal pattern.

13. The process tool exhaust distribution plate of claim 12, wherein each shutter in comprises an iris shutter.

14. The process tool exhaust distribution plate of claim 12, wherein the plurality of exhaust holes is arranged into zones distributed across the exhaust distribution plate.

15. The process tool exhaust distribution plate of claim 14, wherein the zones are based on prescribable patterns of closed exhaust holes, partially opened exhaust holes, and open exhaust holes.

16. A method, comprising:

positioning an exhaust removal port of an exhaust removal system adjacent to a process tool;

inserting an exhaust distribution plate between the process tool and the exhaust removal port, wherein the exhaust distribution plate comprises a plurality of exhaust holes disposed radially across the exhaust distribution plate;

enclosing the process tool and the exhaust distribution plate to provide a controlled exhaust removal environment;

determining, with a control system, a non-radial exhaust removal pattern of open and closed exhaust holes from a non-radial exhaust removal profile; and controlling, with the control system, individual shutters of each exhaust hole in the plurality of exhaust holes to produce the non-radial exhaust removal profile.

17. The method of claim 16, wherein controlling the individual shutters of each exhaust hole in the plurality of exhaust holes comprises controlling an opening of an iris shutter configured to close the exhaust hole.

18. The method of claim 17, wherein controlling the opening of the iris shutter comprises opening the iris shutter from 0% of a diameter of each exhaust hole in the plurality of exhaust holes to at least about 80% of the diameter of each exhaust hole in the plurality of exhaust holes.

19. The method of claim 16, further comprising adjusting a diameter of each exhaust hole in the plurality of exhaust holes.

20. The method of claim 16, further comprising inputting a closed hole, open hole, and partially open hole recipe into a control system.

* * * * *